(12) United States Patent
Hirota et al.

(10) Patent No.: US 10,715,103 B2
(45) Date of Patent: Jul. 14, 2020

(54) RESONATOR AND RESONANCE DEVICE (71) Applicant: Murata Manufacturing Co., Ltd., Nagaokakyo-shi, Kyoto-fu (JP)

(72) Inventors: Wakana Hirota, Nagaokakyo (JP); Toshihiko Unami, Nagaokakyo (JP); Yoshihisa Inoue, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 321 days.

(21) Appl. No.: 15/923,057

(22) Filed: Mar. 16, 2018

(65) Prior Publication Data
US 2018/0205363 A1 Jul. 19, 2018

Related U.S. Application Data (63) Continuation of application No. PCT/JP2016/072553, filed on Aug. 1, 2016.

(30) Foreign Application Priority Data

Dec. 21, 2015 (JP) ................... 2015-248945

(51) Int. Cl.
*H03H 9/17* (2006.01)
*H03H 9/05* (2006.01)
(Continued)

(52) U.S. Cl.
CPC ............ *H03H 9/0595* (2013.01); *H03H 9/10* (2013.01); *H03H 9/1057* (2013.01); *H03H 9/13* (2013.01);
(Continued)

(58) Field of Classification Search
CPC .......... H03H 9/172; H03H 9/178; H03H 9/21; H03H 9/215; H03H 9/1057; H03H 9/205;
(Continued)

(56) References Cited

U.S. PATENT DOCUMENTS 3,636,810 A * 1/1972 Reefman ................ G04C 3/102
84/457
9,584,093 B2 2/2017 Nishimura et al.
(Continued)

FOREIGN PATENT DOCUMENTS

JP         S5797216 A      6/1982
JP         200065580 A     3/2000
(Continued)

OTHER PUBLICATIONS

International Search Report issued for PCT/JP2016/072553, dated Oct. 18, 2016.
(Continued)

*Primary Examiner* — J. San Martin
(74) *Attorney, Agent, or Firm* — Arent Fox LLP (57) ABSTRACT

A resonator including a base; two or more vibration arms connected at ends thereof to a front end of the base and spaced apart from each other across a predetermined space and extending away from the base. Moreover, a connection member connects the vibration arms that bend in the same direction when an electric field is applied. The resonator inhibit occurrence of a spurious mode that otherwise occurs in a resonator that performs out-of-plane bending.

20 Claims, 6 Drawing Sheets (51) Int. Cl.
*H03H 9/10* (2006.01)
*H03H 9/24* (2006.01)
*H03H 9/13* (2006.01)
*H03H 9/15* (2006.01)

(52) U.S. Cl.
CPC ............ *H03H 9/17* (2013.01); *H03H 9/2489* (2013.01); *H03H 2009/155* (2013.01)

(58) Field of Classification Search
CPC ..... H03H 2003/0492; H03H 2003/026; H03H 3/04; B06B 1/0603; B06B 1/0607
See application file for complete search history.

(56) References Cited

U.S. PATENT DOCUMENTS

| | | | |
|---|---|---|---|
| 9,866,199 B2 | 1/2018 | Nishimura et al. | |
| 2005/0062368 A1* | 3/2005 | Hirasawa | H03H 9/09 310/370 |
| 2006/0082261 A1* | 4/2006 | Tanaya | G01C 19/5607 310/370 |
| 2009/0174286 A1* | 7/2009 | Yoshimatsu | H03H 3/04 310/321 |
| 2016/0065173 A1 | 3/2016 | Nishimura et al. | |
| 2016/0072473 A1 | 3/2016 | Nishimura et al. | |
| 2016/0197597 A1 | 7/2016 | Yamada et al. | |

FOREIGN PATENT DOCUMENTS

| | | |
|---|---|---|
| JP | 5071058 B2 | 11/2012 |
| WO | 2014185282 A1 | 11/2014 |
| WO | 2015041152 A1 | 3/2015 |

OTHER PUBLICATIONS

Written Opinion of the International Searching Authority issued for PCT/JP2016/072553, dated Oct. 18, 2016.

* cited by examiner

RESONATOR AND RESONANCE DEVICE

CROSS REFERENCE TO RELATED APPLICATIONS

The present application is a continuation of PCT/JP2016/072553 filed Aug. 1, 2016, which claims priority to Japanese Patent Application No. 2015-248945, filed Dec. 21, 2015, the entire contents of each of which are incorporated herein by reference.

TECHNICAL FIELD

The present disclosure relates to a resonator and a resonance device in which a plurality of vibration arms vibrate in a bending vibration mode.

BACKGROUND

Currently, resonance devices using a MEMS (Micro Electro Mechanical Systems) technique are used as timing devices, for example. Such a resonance device is generally mounted on a printed circuit board that is incorporated into an electronic device such as a smartphone. The resonance device includes a lower substrate, an upper substrate that forms a cavity between the lower substrate and the upper substrate, and a resonator that is disposed within the cavity between the lower substrate and the upper substrate.

Figure 1:
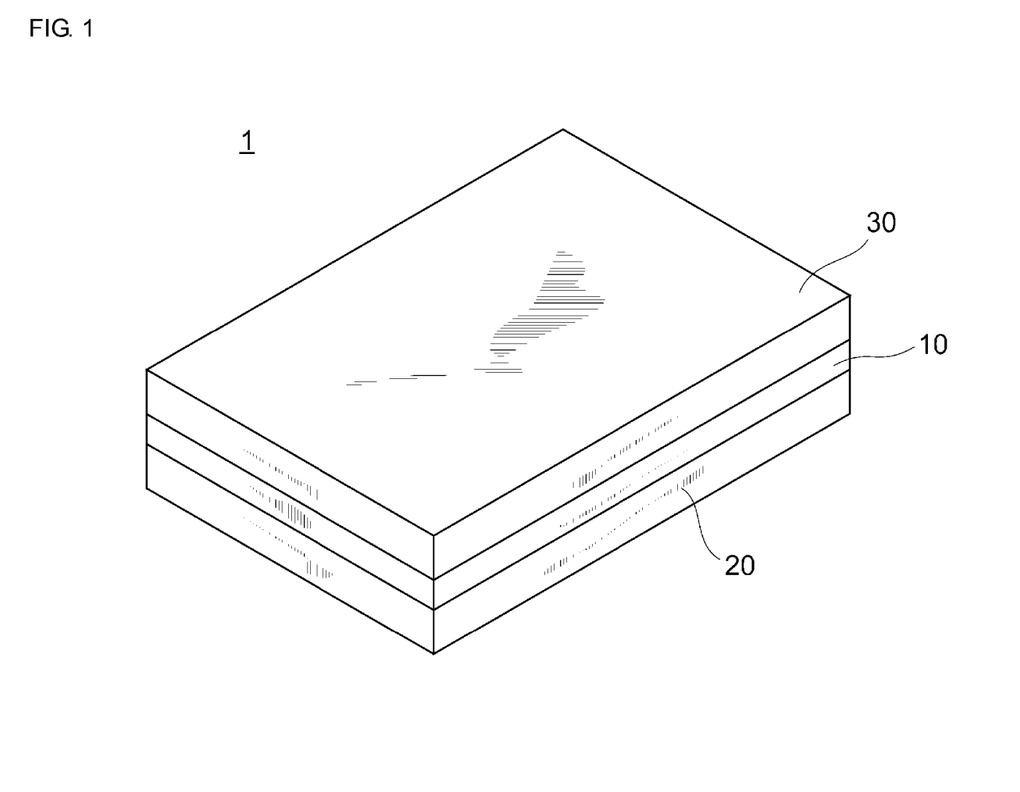
FIG. 1 is a perspective view schematically showing the appearance of a resonance device according to a first exemplary embodiment.

For example, Patent Document 1 (identified below) discloses an out-of-plane bending resonator having a plurality of vibration arms. In the resonator, each vibration arm is connected at a fixed end thereof to a front end of a base portion, and the base portion is connected at a rear end thereof, which is opposite to the front end thereof, to a support portion. For example, the support portion is connected to a base that is interposed between the lower substrate and the upper substrate. In the example of FIG. 1 of Patent Document 1, since electric fields to be applied to the vibration arms are set in directions opposite to each other, vibrations in opposite phases are achieved between an inner vibration arm and outer two vibration arms.

Patent Document 1: Japanese Patent No. 5071058.

However, in the existing resonance device disclosed in Patent Document 1, for example, an unwanted vibration mode (spurious mode) occurs at frequencies around a main vibration mode at a desired frequency. Accordingly, the characteristics of main vibration are degraded.

SUMMARY OF THE INVENTION

The exemplary embodiments of the present disclosure have been made in view of such circumstances, and an object of the exemplary embodiments is to inhibit occurrence of a spurious mode.

Thus, a resonator according to an exemplary aspect includes a base and a plurality of vibration arms having a piezoelectric substance and a pair of electrode layers opposing each other with the piezoelectric substance interposed therebetween. Moreover, the vibration arms are connected at ends thereof to a front end of the base, and provided so as to be spaced apart from each other across a predetermined space and to extend in a direction away from the base. Furthermore, a connection portion is include that connects parts of vibration arms bending in the same direction when an electric field is applied, among the plurality of vibration arms.

According to the exemplary embodiments of the present disclosure, the occurrence of a spurious mode in a resonator that performs out-of-plane bending can be inhibited.

DETAILED DESCRIPTION OF EXEMPLARY EMBODIMENTS

First Embodiment

Figure 2:
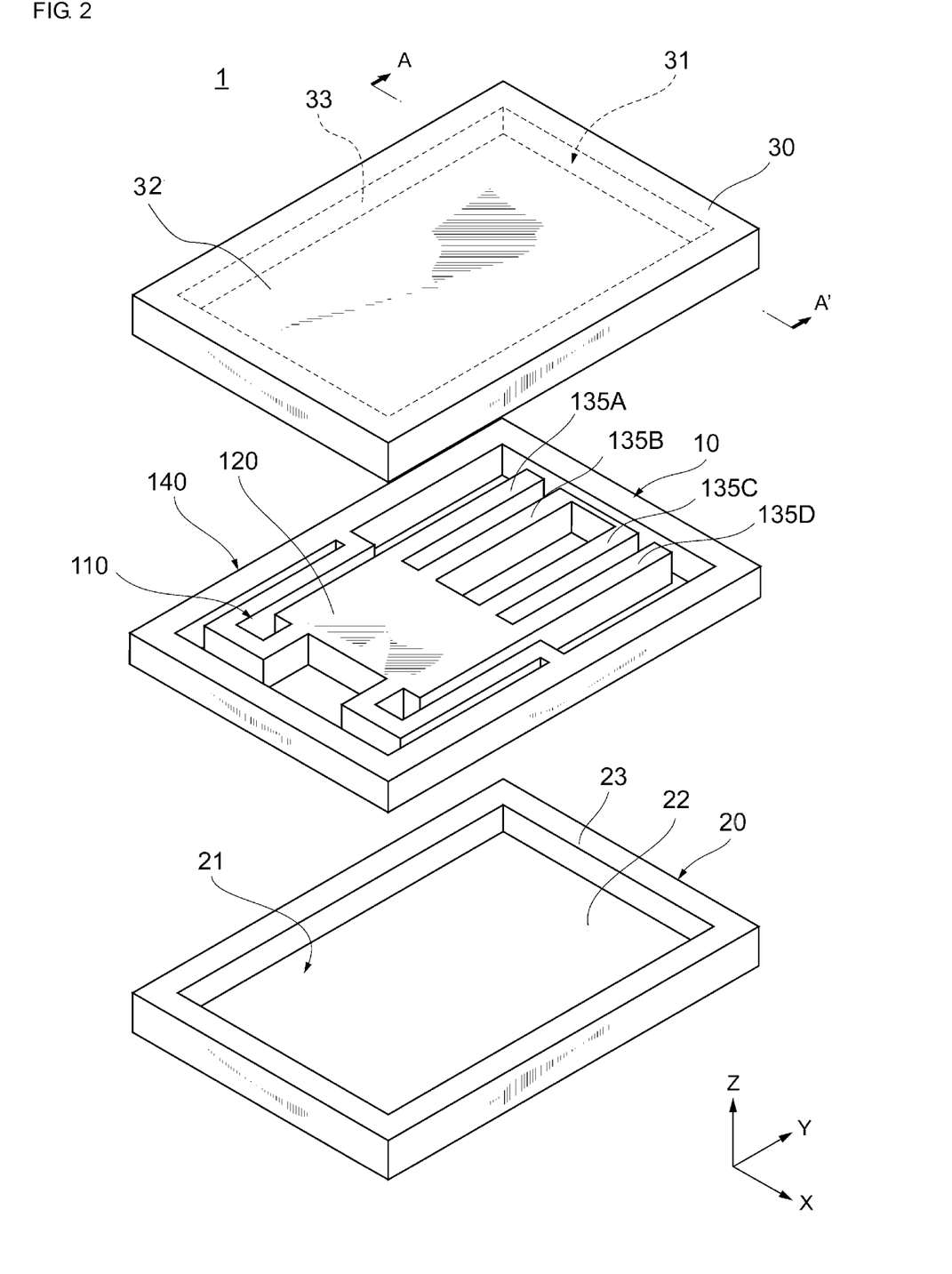
FIG. 2 is an exploded perspective view schematically showing the structure of the resonance device according to the first exemplary embodiment.

Hereinafter, a first exemplary embodiment of the present disclosure will be described with reference to the accompanying drawings. FIG. 1 is a perspective view schematically showing the appearance of a resonance device 1 according to the first exemplary embodiment. FIG. 2 is an exploded perspective view schematically showing the structure of the resonance device 1 according to the first exemplary embodiment.

As shown, the resonance device 1 includes a resonator 10, and an upper cover 30 and a lower cover 20 provided with the resonator 10 interposed therebetween. That is, the resonance device 1 is formed by the lower cover 20, the resonator 10, and the upper cover 30 being laminated in this order.

The resonator 10, and the lower cover 20 and the upper cover 30 are joined, whereby the resonator 10 is sealed and a vibration space for the resonator 10 is formed. Each of the resonator 10, the lower cover 20, and the upper cover 30 is formed by using a Si substrate. The resonator 10, the lower cover 20, and the upper cover 30 are joined to each other by the Si substrates being joined to each other. Each of the resonator 10 and the lower cover 20 may be formed by using an SOI substrate, for example.

Moreover, the resonator 10 is a MEMS resonator preferably produced by using a MEMS technique. In the present embodiment, the resonator 10 will be described as a resonator formed by using a silicon substrate, for example. However, the resonator 10 may be formed by using a substrate other than silicon, such as amorphous Si, SiC, SiGe, Ge, gallium arsenic, and crystal.

Hereinafter, each component of the resonance device 1 will be described in detail.

(1. Upper Cover 30)

As shown, the upper cover 30 has a bottom plate 32 that has a rectangular flat plate shape and that is provided along an XY plane, and has a recess 31 formed in a back surface thereof and having a flattened rectangular parallelepiped shape, for example. The recess 31 is surrounded by a side wall 33 and forms a part of the vibration space that is a space in which the resonator 10 vibrates.

(2. Lower Cover 20)

Moreover, the lower cover 20 has a bottom plate 22 that is provided along the XY plane and that has a rectangular flat plate shape; and a side wall 23 that extends from the periphery of the bottom plate 22 in a Z-axis direction (that is, a lamination direction of the lower cover 20 and the resonator 10). A recess 21 is provided in the surface of the lower cover 20 opposing the resonator 10 so as to be formed by the front surface of the bottom plate 22 and the inner surface of the side wall 23. The recess 21 forms a part of the vibration space for the resonator 10. The vibration space is hermitically sealed by the above-described upper cover 30 and lower cover 20, and a vacuum state is maintained. The vibration space may be filed with a gas such as an inert gas.

(3. Resonator 10)

Figure 3:
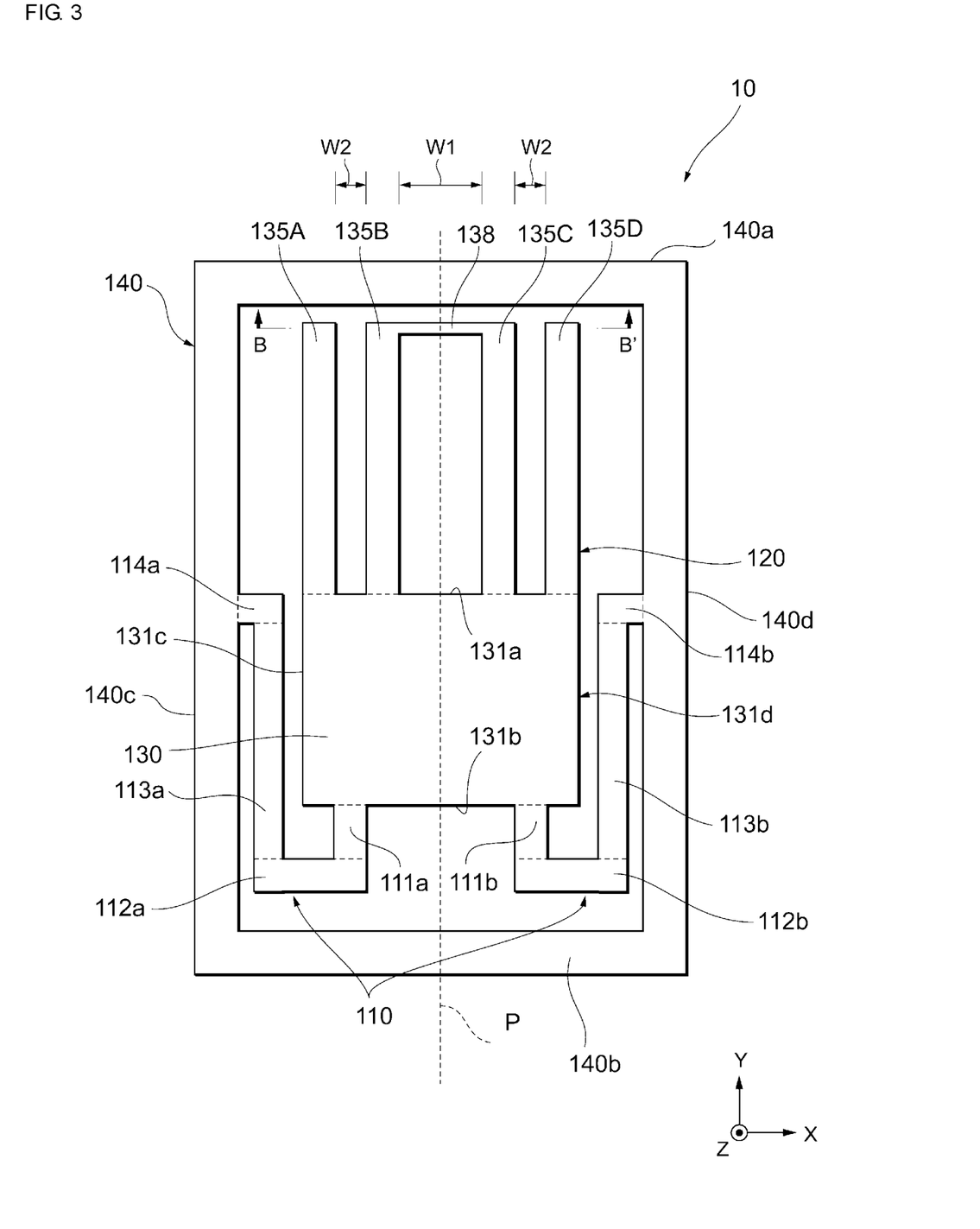
FIG. 3 is a plan view of a resonator according to the first exemplary embodiment from which an upper substrate is removed.

FIG. 3 is a plan view schematically showing the structure of the resonator 10 according to the present embodiment. Each component of the resonator 10 according to the present embodiment will be described with reference to FIG. 3. The resonator 10 includes a vibration portion 120, a holding portion 140 (i.e., a "frame"), and a holding arm 110 (shown as a pair of holding arms 110).

(a) Vibration Portion 120

The vibration portion 120 has a rectangular contour spreading along the XY plane in a rectangular coordinate system in FIG. 3. The vibration portion 120 is provided inside the holding portion 140, and a space is formed with a predetermined gap between the vibration portion 120 and the holding portion 140. In the example of FIG. 3, the vibration portion 120 has a base 130, four vibration arms 135A to 135D (also collectively referred to as "vibration arm 135"), and a connection portion 138. It should be appreciated that the number of vibration arms is not limited to four and can be, for example, a number equal to or greater than 2 according to other embodiments.

In the present embodiment, each vibration arm 135 and the base 130 are formed so as to be integrated with each other.

As further shown, the base 130 has long sides 131a (an example of a front end) and 131b in an X-axis direction and short sides 131c and 131d in a Y-axis direction. The base 130 is connected and held at the long side 131b to the holding portion 140 by the later-described holding arm 110. The base 130 has a substantially rectangular shape in a plan view in the example of FIG. 3. However, it is noted that the shape of the base 130 is not limited thereto, and the base 130 only needs to be formed so as to be substantially symmetrical about a plane defined along the perpendicular bisector of the long side 131a. For example, the shape of the base 130 may be a trapezoid having a long side 131b shorter than a long side 131a, or a semicircle having a diameter at the long side 131a. The long sides 131a and 131b and the short sides 131c and 131d are not limited to straight lines and may be curved lines.

According to the exemplary aspect, each vibration arm 135 extends parallel to the Y-axis direction between the base 130 and the holding portion 140, with one end thereof being connected as a fixed end to the long side 131a of the base 130, and the other end thereof being a free end extending away from the base 130. In addition, the respective vibration arms 135 are provided so as to be aligned and spaced apart from each other across predetermined spaces the X-axis direction. Specifically, the vibration arm 135B (an example of a third vibration arm) and the vibration arm 135C (an example of a fourth vibration arm) are provided between the vibration arm 135A (an example of a first vibration arm) and the vibration arm 135D (an example of a second vibration arm).

In the vibration portion 120 of the present embodiment, an interval W1 in the X-axis direction between the vibration arms 135B and 135C is set so as to be larger than an interval W2 in the X-axis direction between the outer vibration arm 135A (135D) and the inner vibration arm 135B (135C) adjacent to the outer vibration arm 135A (135D). The interval W1 is, for example, about 25 µm, and the interval W2 is, for example, about 5 µm. By setting the interval W2 so as to be smaller than the interval W1, the vibration characteristics can be advantageously improved. In addition, to achieve size reduction of the resonance device 1, the interval W1 may be set so as to be smaller than the interval W2, or may be equal to the interval W2.

According to the exemplary embodiment, the connection portion 138 (also referred to as a "vibration arm connector" or a "connection member") connects the same parts of the vibration arms to which electric fields having the same phase are applied, among the vibration arms 135. In the present embodiment, the connection portion 138 connects the distal ends (i.e., the free ends opposite the ends fixed to the base 130) of the vibration arm 135B and the vibration arm 135C. The connection portion 138 has, for example, a width along the Y-axis direction of about 50 µm, and a length along the X-axis direction of about 25 µm.

It should be noted that the connection portion 138 is not limited to the configuration in which the connection portion 138 is provided at the distal ends of the vibration arms 135B and 135C, and only needs to be configured to connect at least parts of the vibration arms 135B and 135C. More preferably, the length along a Y axis of the connection portion 138 is shorter than the sum of the lengths along the Y axis of the spaces provided between the vibration arms 135B and 135C. For example, the connection portion 138 may be configured to connect the vibration arms 135B and 135C at a plurality of locations.

(b) Holding Portion 140

The holding portion 140 is formed in a rectangular frame shape along the XY plane. The holding portion 140 is provided along the XY plane so as to surround the outer side portion of the vibration portion 120 in a plan view. The holding portion 140 only needs to be provided at least at a part of the periphery of the vibration portion 120, and the shape of the holding portion 140 is not limited to the frame shape. For example, the holding portion 140 only needs to be provided at the periphery of the vibration portion 120 so as to be able to hold the vibration portion 120 and join the upper cover 30 and the lower cover 20.

In the present embodiment, the holding portion 140 includes square-column-shaped frame bodies 140a to 140d that are formed so as to be integrated with each other to form a holding frame for the device 10.

As shown in FIG. 3, the frame body 140a is provided so as to oppose the free end of the vibration arm 135 and such that the longitudinal direction thereof is parallel to an X axis. The frame body 140b is provided so as to oppose the long side 131b of the base 130 and such that the longitudinal direction thereof is parallel to the X axis. The frame body 140c is provided so as to oppose the short side 131c of the base 130 and the vibration arm 135A and such that the longitudinal direction thereof is parallel to the Y axis. The frame body 140c is connected at both ends thereof to ends of the frame bodies 140a and 140b. The frame body 140d is provided so as to oppose the short side 131d of the base 130 and the vibration arm 135D and such that the longitudinal direction thereof is parallel to the Y axis. The frame body 140d is connected at both ends thereof to the other ends of the frame bodies 140a and 140b.

(c) Holding Arm 110

The holding arm 110 is provided inside the holding portion 140 and connects the long side 131b of the base 130 and the frame bodies 140c and 140d.

The holding arm 110 is integrally formed and can be a pair of arms that each have a plurality of arms 111a, 112a, 113a, and 114a and 111b, 112b, 113b, and 114b that are bent in the Z-axis direction and that have a square column plate shape. In addition, the holding arm 110 is formed so as to be substantially plane-symmetrical about a virtual plane P defined parallel to the YZ plane along the center line in the X-axis direction of the base 130.

As shown, the arm 111a is provided between the base 130 and the frame body 140b so as to oppose the frame body 140c and such that the longitudinal direction thereof is parallel to the Y axis. One end of the arm 111a is connected to the base 130 at the long side 131b of the base 130, and the arm 111a extends therefrom substantially perpendicular to the long side 131b, that is, in the Y-axis direction. The other end of the arm 111a is connected to the side surface (the upper surface on the XZ plane), opposing the long side 131b, at one end of the arm 112a.

The arm 112a is provided between the base 130 and the frame body 140c so as to oppose the frame body 140b and such that the longitudinal direction thereof is parallel to the X axis. The other end of the arm 112a is connected to one end of the arm 113a at a side surface (the upper surface on the XZ plane) thereof.

The arm 113a is provided between the base 130 and the frame body 140c so as to oppose the frame body 140c and such that the longitudinal direction thereof is parallel to the Y axis. The other end of the arm 113a is connected to a side surface, opposing the frame body 140b, at one end of the arm 114a.

The arm 114a is provided between the vibration arm 135A and the frame body 140c so as to oppose the frame body 140a and such that the longitudinal direction thereof is parallel to the X axis. The other end of the arm 114a is connected to the frame body 140c in the vicinity of a region of the frame body 140c that opposes the fixed end of the vibration arm 135A. That is, the other end of the arm 113a is fixed to the frame body 140c at the lateral side of the vibration arm 135A.

According to the exemplary embodiment, the configurations of the arms 111b to 114b are the same as the configurations of the arms 111a to 114a.

As described above, the holding arm 110 according to the present embodiment is configured to be connected at the ends of the arms 111a and 111b to the base 130, be bent at the connection locations between the other ends of the arms 111a and 111b and the arms 112a and 112b, be bent again at the connection locations between the arms 112a and 112b and the arms 113a and 113b, be further bent at the connection locations between the arms 113a and 113b and the arms 114a and 114b, and be connected to the holding portion 140. Since the holding arm 110 according to the present embodiment has such a bent structure, the holding arm 110 is able to hold the base 130 without interfering with bending displacement of the base 130. As a result, it is possible to reduce an increase in frequency during driving with large amplitude. As a result, the resonator 10 according to the present embodiment is able to inhibit shift of the resonant frequency.

It is noted that the shape of the holding arm 110 is not limited to the shape bent at a right angle at the connection location of each arm. The connection location of each arm of the holding arm 110 may have a curved line shape. In addition, the structure of the holding arm 110 is not limited to the bent structure, and the holding arm 110 may be configured to be connected to the long side 131b of the base 130, extend therefrom in the Y-axis direction, and be connected to the frame body 140b, for example. Furthermore, the connection location between the holding arm 110 and the base 130 is not limited to the long side 131b of the base 130. For example, the holding arm 110 may be configured to be connected to the short sides 131c and 131d of the base 130, be bent, and be connected to the frame bodies 140c and 140d.

(4. Multilayer Structure)

Figure 4:
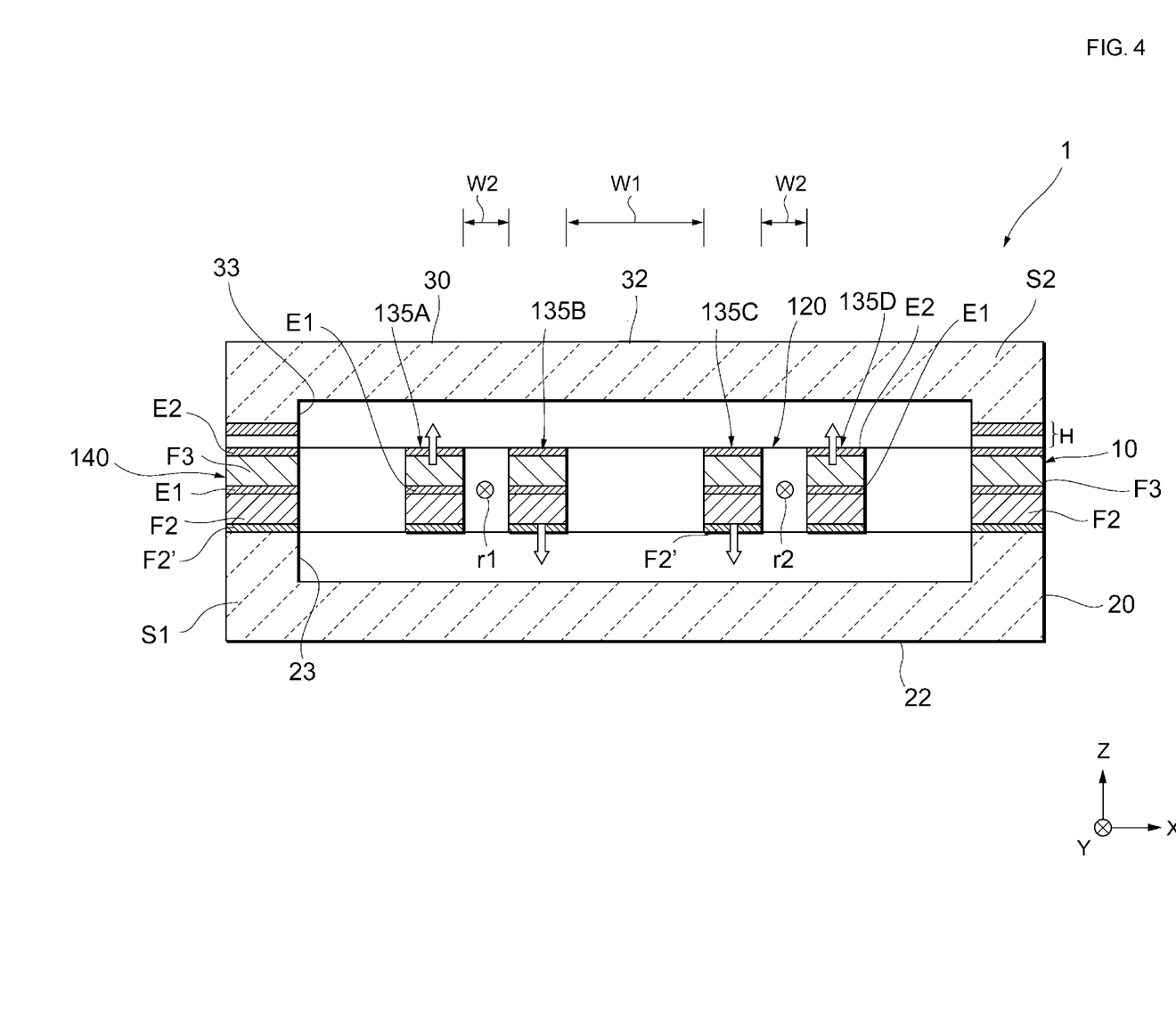
FIG. 4 is a cross-sectional view taken along the line AA' in FIG. 1.

The multilayer structure of the resonance device 1 will be described with reference to FIG. 4. FIG. 4 is a cross-sectional view taken along the line AA' in FIG. 1.

As shown in FIG. 4, in the resonance device 1 according to the present embodiment, the holding portion 140 of the resonator 10 is joined on the side wall 23 of the lower cover 20, and the holding portion 140 of the resonator 10 and the side wall 33 of the upper cover 30 are joined to each other. The resonator 10 is held between the lower cover 20 and the upper cover 30 in this manner, and the vibration space in which the vibration arm 135 vibrates is formed by the lower cover 20, the upper cover 30, and the holding portion 140 of the resonator 10.

The bottom plate 22 and the side wall 23 of the lower cover 20 are integrally formed of a Si (silicon) wafer S1. It should be noted that it is also possible to form a silicon oxide (for example, $SiO_2$ (silicon dioxide)) on the upper surface of the side wall 23 and join the lower cover 20 and the holding portion 140 of the resonator 10 by the silicon oxide film. The thickness of the lower cover 20 defined in the Z-axis direction is, for example, 150 μm, and the depth of the recess 21 defined in the Z-axis direction is, for example, 50 μm.

The bottom plate 32 and the side wall 33 of the upper cover 30 are formed of a Si (silicon) wafer S2 having a predetermined thickness. As shown in FIG. 4, the upper cover 30 is joined at the peripheral portion (side wall 33) thereof to the holding portion 140 of the resonator 10. A joint portion H is formed between the peripheral portion of the upper cover 30 and the holding portion 140 in order to join the upper cover 30 and the holding portion 140. The joint portion H is formed of, for example, Al (aluminum) and Ge (germanium) films, or an Au (gold) film and a Sn (tin) film.

In the resonator 10, the holding portion 140, the base 130, the vibration arm 135, and the holding arm 110 are integrally formed by the same process in the exemplary embodiment. In the resonator 10, first, a metal layer E1 is laminated on a Si (silicon) substrate F2 (an example of a substrate). A piezoelectric thin film F3 is laminated on the metal layer E1 so as to cover the metal layer E1, and further a metal layer E2 is laminated on the piezoelectric thin film F3.

The Si substrate F2 is formed from, for example, a degenerate n-type Si semiconductor having a thickness of about 10 μm, and may contain P (phosphorus), As (arsenic), or Sb (antimony), or the like as an n-type dopant. The resistance value of degenerate Si to be used for the Si substrate F2 is, for example, not less than 0.5 mΩ·cm and not greater than 0.9 mΩ·cm, and a rotation angle formed by the vibration arm and the [100] crystal axis of the n-type Si layer (Si substrate F2) or a crystal axis equivalent thereto is desirably within the range of not less than 0 degrees and not greater than 15 degrees or within the range of not less than 75 degrees and not greater than 90 degrees. Furthermore, a silicon oxide (for example, $SiO_2$) layer F2' is formed on the lower surface of the Si substrate F2. Accordingly, it is possible to join the lower cover 20 and the Si substrate F2.

The metal layers E2 and E1 are formed by using, for example, Mo (molybdenum), aluminum (Al), or the like having a thickness of about 0.1 μm. The Si substrate F2 is able to serve as the metal layer E1 by using degenerate Si for the Si substrate F2.

The Si substrate F2, the piezoelectric thin film F3, the silicon oxide layer F2', and the metal layers E2 and E1 are formed in a desired shape by etching or the like. The metal layer E1 is formed, for example, on the vibration portion 120 so as to serve as a lower electrode (an example of an electrode layer). The metal layer E1 is formed on the holding arm 110 and the holding portion 140 so as to serve as a wire for connecting the lower electrode to an AC power supply provided outside the resonator 10.

Meanwhile, the metal layer E2 is formed on the vibration portion 120 so as to serve as an upper electrode (an example of the electrode layer). In addition, the metal layer E2 is formed on the holding arm 110 and the holding portion 140 so as to serve as a wire for connecting the upper electrode to the AC power supply provided outside the resonator 10.

For connection from the AC power supply to a lower wire or an upper wire, an electrode may be formed on the outer surface of the upper cover 30 to connect the AC power supply to the lower wire or the upper wire, or a via may be formed within the upper cover 30, and a conductive material is filled into the via to provide a wire that connects the AC power supply to the lower wire or the upper wire.

The piezoelectric thin film F3 is a piezoelectric thin film that converts an applied voltage to vibration, and may contain, for example, an oxide or a nitride such as AlN (aluminum nitride), as a principal component. Specifically, the piezoelectric thin film F3 may be formed from ScAlN (scandium aluminum nitride). ScAlN is obtained by substituting a part of aluminum in aluminum nitride with scandium. In addition, the piezoelectric thin film F3 has, for example, a thickness of preferably not less than 0.2 μm and not greater than 2 μm, and more preferably about 1 μm.

Moreover, the piezoelectric thin film F3 expands and contracts in the in-plane direction of the XY plane, that is, in the Y-axis direction, in accordance with an electric field applied to the piezoelectric thin film F3 by the metal layers E2 and E1. Due to the expansion and contraction of the piezoelectric thin film F3, the vibration arm 135 displaces the free end thereof toward the inner surfaces of the lower cover 20 and the upper cover 30 to vibrate in an out-of-plane bending vibration mode.

In the present embodiment, the phase of an electric field to be applied to the outer vibration arms 135A and 135D and the phase of an electric field to be applied to the inner vibration arms 135B and 135C are set so as to be opposite to each other. Accordingly, the outer vibration arms 135A and 135D and the inner vibration arms 135B and 135C are displaced in directions opposite to each other during excitation. For example, when the outer vibration arms 135A and 135D displace the free ends thereof toward the inner surface of the upper cover 30, the inner vibration arms 135B and 135C displace the free ends thereof toward the inner surface of the lower cover 20.

Figure 5:
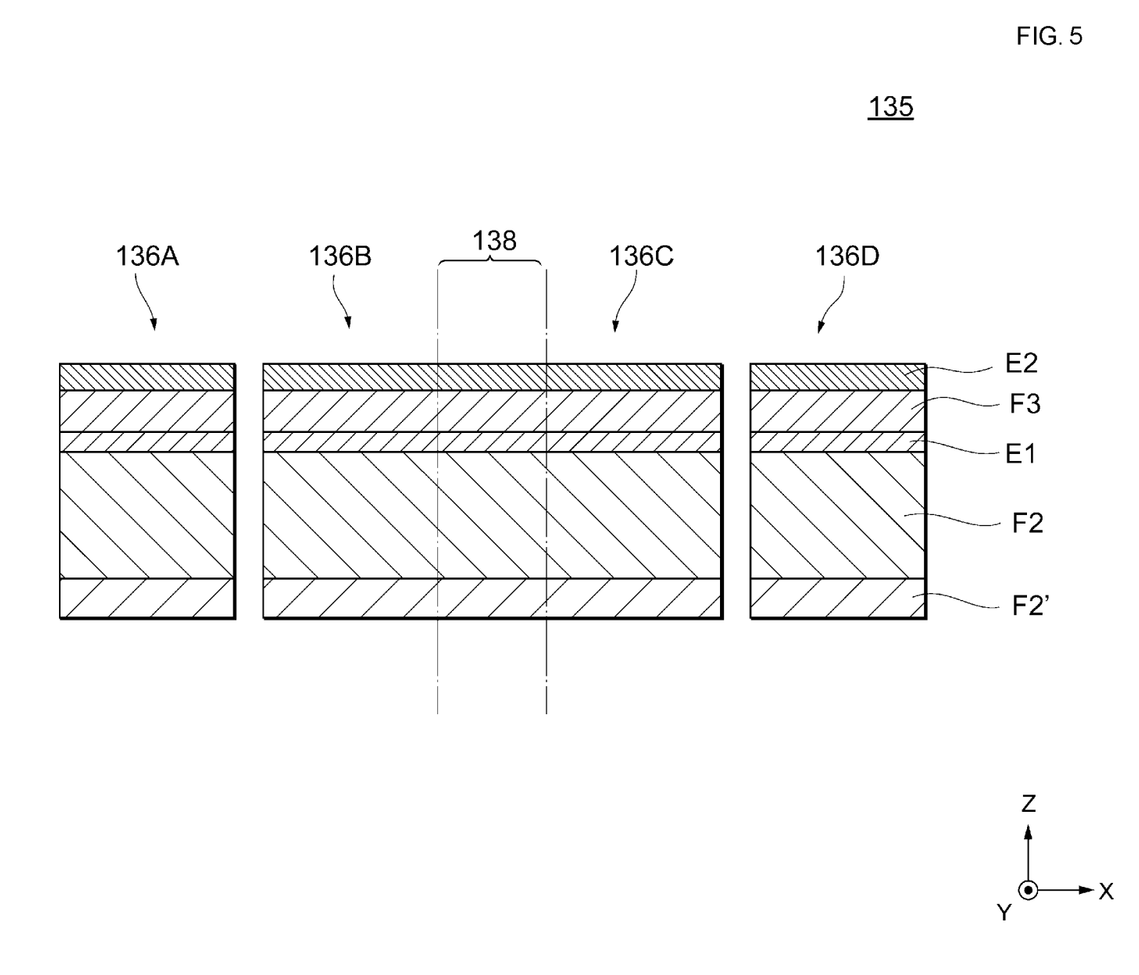
FIG. 5 is a cross-sectional view taken along the line BB' in FIG. 3.

FIG. 5 corresponds to a BB' cross-section of FIG. 3 and is a diagram showing cross-sections of the distal end of the vibration arm 135 and the connection portion 138 of the vibration portion 120 according to the present embodiment.

In the example of FIG. 5, the connection portion 138 has the Si substrate F2, the metal layer E1 laminated on the Si substrate F2, the piezoelectric thin film F3 laminated on the metal layer E1, and the metal layer E2 further laminated on the piezoelectric thin film F3. The multilayer structure of the connection portion 138 is not limited thereto, and may be, for example, a multilayer structure that is the same as the multilayer structure of the vibration arm 135. In addition, the multilayer structure of the connection portion 138 may be a structure not having the metal layer E1, the piezoelectric thin film F3, and the metal layer E2 in the multilayer structure of the vibration arm 135.

In the resonance device 1 as described above, during vibration in opposite phases, the vibration arm 135A and the vibration arm 135B vibrate in vertically opposite directions about a central axis r1 extending parallel to the Y axis between the vibration arm 135A and the vibration arm 135B shown in FIG. 4. In addition, the vibration arm 135C and the vibration arm 135D vibrate in vertically opposite directions about a central axis r2 extending parallel to the Y axis between the vibration arm 135C and the vibration arm 135D. Accordingly, torsional moments in directions opposite to each other occur at the central axes r1 and r2, and bending vibration occurs at the base 130. At this time, in the base 130 that does not have the connection portion 138, movement along the X-axis direction occurs due to the torsional moments. Accordingly, unwanted vibration may occur in a frequency band around main vibration at a desired frequency.

In the present embodiment, the vibration arm 135B and the vibration arm 135C are connected to each other by the connection portion 138. Thus, the vibration arm 135B and the vibration arm 135C are able to assuredly vibrate in the same phase. As a result, in the resonator 10 according to the present embodiment, it is possible to inhibit movement of the base 130 along the X-axis direction, so that it is possible to inhibit occurrence of an unwanted vibration mode. Accordingly, it is possible to improve the characteristics of main vibration of the vibration arm 135.

Furthermore, when the resonator 10 is compared to a resonator of a comparative example having the same configuration as the resonator 10 according to the present embodiment except not having the connection portion 138, it is possible to improve the value of a coefficient k of coupling between the vibration arm 135B and the vibration arm 135C in the resonator 10. Specifically, when the rotation angle formed by the vibration arm and the [100] crystal axis of the n-type Si layer (Si substrate F2) or a crystal axis equivalent thereto is 0 degrees, the value of the coefficient k of coupling is about 6.08 in the resonator of the comparative example. On the other hand, the efficient k of coupling of the resonator 10 according to the present embodiment improves to about 6.16.

Second Embodiment

In second and subsequent embodiments, the description of matters common to the first exemplary embodiment is omitted, and the differences will be described. In particular, the same advantageous effects achieved by the same configuration are not mentioned successively in each embodiment.

Figure 6:
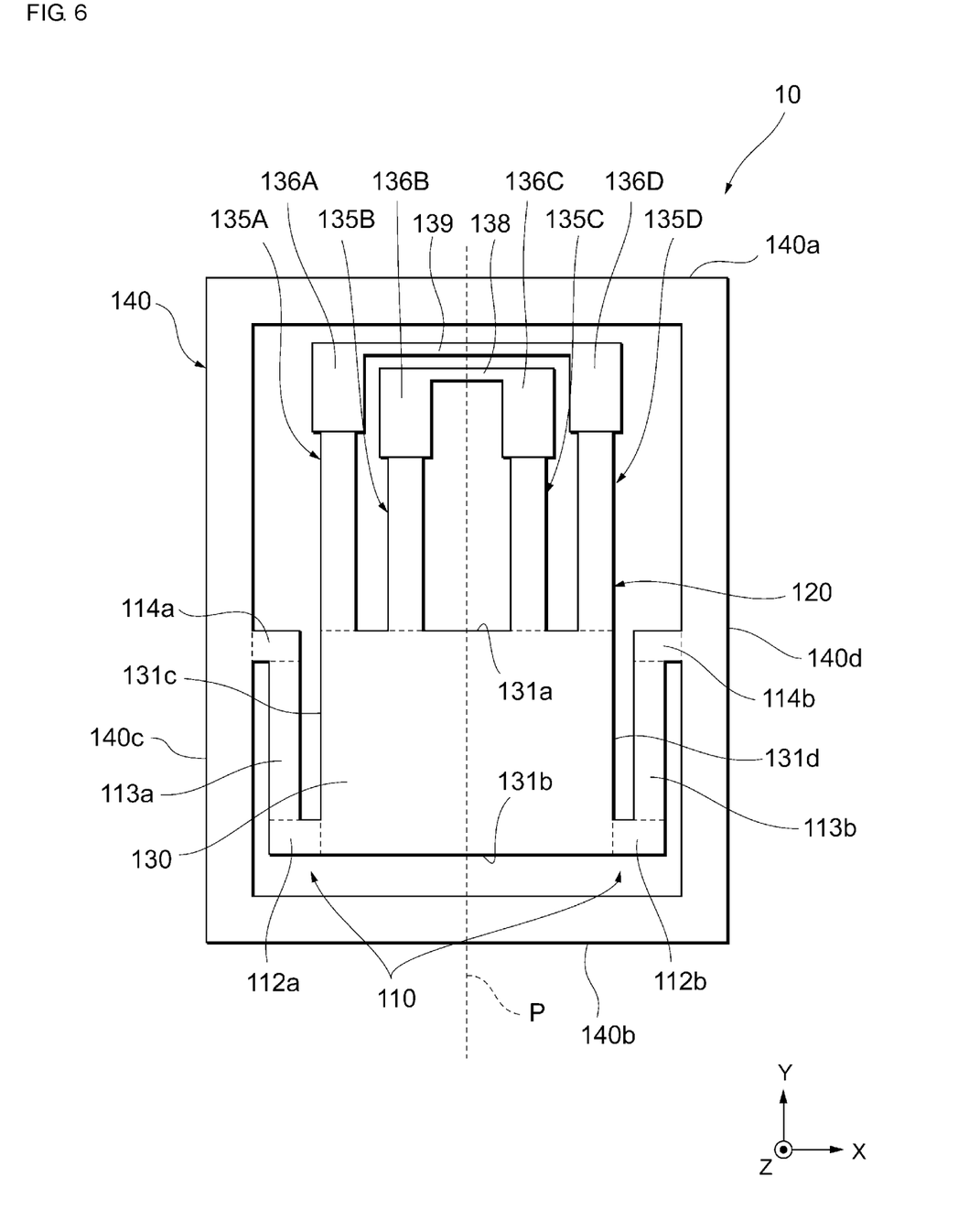
FIG. 6 is a plan view of a resonator according to a second exemplary embodiment, corresponding to FIG. 3, from which an upper substrate is removed.

In particular, FIG. 6 is a diagram showing an example of a plan view of a resonator 10 according to the another exemplary embodiment. Hereinafter, of the detailed configuration of the resonance device 1 according to the present embodiment, the difference from the first embodiment will be mainly described.

In the present embodiment, the vibration portion 120 has a connection portion 139 in addition to the connection portion 138. The connection portion 139 connects the distal ends of the vibration arm 135A and the vibration arm 135D. The vibration arm 135 according to the present embodiment may be configured to have the connection portion 139 and not to have the connection portion 138.

Furthermore, weights 136A to 136D having a larger width in the X-axis direction than that at the fixed end side of the vibration arms 135A to 135D (hereinafter, the weights 136A to 136D are also collectively referred to as "weight portion 136") are formed at the free end side of the vibration arms 135A to 135D. The weight portion 136 has, for example, a width along the X-axis direction of about 70 μm, and the interval between the weight portions 136 is about 5 μm. The weight portion 136 preferably has the same multilayer structure as that of the vibration arm 135 but is not limited thereto. The weight portion 136 may be composed of, for example, only a Si substrate F2 and a metal layer E2. Furthermore, a plurality of layers may be formed on the same multilayer structure as that of the vibration arm 135. For example, an insulating layer such as AlN may be formed, and a Mo layer having a larger weight may be further formed thereon. Accordingly, it is possible to achieve improvement of the coefficient k of coupling by preventing a voltage from being applied to the vibration arm distal end side of the piezoelectric thin film F3 while the weight of the distal end portion is increased.

In the present embodiment, the holding arm 110 does not have a configuration corresponding to the arms 111a and 111b in the first embodiment and is connected at the arms 112a and 112b to the short sides 131c and 131d of the base 130.

As described above, the resonator 10 according to the present embodiment has a configuration in which the vibration arms 135A and 135D provided at the outer side portion of the front end of the base 130 and the vibration arms 135B and 135C provided inside the vibration arms 135A and 135D are connected by the connection portions 139 and 138, respectively. Therefore, it is possible to assuredly vibrate the inner vibration arms in the same phase and vibrate the outer vibration arms in the same phase. Accordingly, it is possible to inhibit occurrence of an unwanted vibration mode. As a result, it is possible to further improve the characteristics of main vibration.

In the present embodiment, the holding arm 110 is connected to the frame bodies 140c and 140d of the holding portion 140 in the regions lateral to the vibration arm 135. In other words, in the resonance device 1 according to the present embodiment, the holding arm 110 is not provided between the free end of the vibration arm 135 and the frame body 140b of the holding portion 140. Accordingly, it is possible to reduce the size of the resonance device 1 in the longitudinal direction of the vibration arm 135.

The other configuration and effect are the same as those of the first embodiment.

The illustrative exemplary embodiments of the present disclosure have been described above. Thus, the resonator 10 according to the present embodiment includes the base 130; a plurality of the vibration arms 135 having the piezoelectric thin film F3 and a pair of the metal layers E1 and E2 opposing each other with the piezoelectric thin film F3 interposed therebetween, connected at ends thereof to the long side 131a of the base 130, and provided so as to be spaced apart from each other across a predetermined space and extend in a direction away from the base 130; and the connection portion 138 connecting parts of vibration arms bending in the same direction when an electric field is applied, among the plurality of the vibration arms 135.

Accordingly, it is possible to inhibit occurrence of a spurious mode in the resonator 10 which performs out-of-plane bending.

Preferably, the plurality of the vibration arms 135 include the vibration arm 135A and the vibration arm 135D, and the vibration arm 135B and the vibration arm 135C provided between the vibration arm 135A and the vibration arm 135D, and the connection portion 138 connects the vibration arm 135A and the vibration arm 135D or the vibration arm 135B and the vibration arm 135C. More preferably, the connection portion 138 connects the other ends of the vibration arm 135B and the vibration arm 135C. According to the preferred mode, the vibration arm 135B and the vibration arm 135C are able to assuredly vibrate in the same phase. As a result, in the resonator 10 according to the present embodiment, it is possible to inhibit movement of the base 130 along the X-axis direction, so that it is possible to inhibit occurrence of an unwanted vibration mode. Accordingly, it is possible to improve the characteristics of main vibration of the vibration arms 135.

The vibration arm 135A and the vibration arm 135D or the vibration arm 135B and the vibration arm 135C preferably have substantially the same shape. According to the preferred mode, it is possible to further improve the characteristics of main vibration of the vibration arms 135.

The resonance device 1 according to the present embodiment includes the above-described resonator 10, and the upper cover 30 and the lower cover 20 opposing each other with the resonator 10 interposed therebetween. Accordingly, it is possible to inhibit occurrence of a spurious mode in the resonator 10 which performs out-of-plane bending.

It is to be noted that each exemplary embodiment described above is intended to facilitate understanding of the present invention, but not intended to construe the present invention in any limited way. Modifications and/or improvements can be made to the present invention without departing from the spirit of the invention, and the present invention encompasses equivalents thereof. That is, each embodiment for which the design is changed as appropriate by a person skilled in the art is also included in the scope of the present invention as long as the features of the present invention are included. For example, each element included in each embodiment, and the arrangement, material, conditions, shape, size, etc. thereof are not limited to illustrated ones, and may be changed as appropriate. For example, the holding arm 110 has been described as being configured to be bent twice in the aforementioned embodiment, but is not limited thereto. For example, the holding arm 110 may be configured not to be bent at all and to connect the long side 131b of the base 130 and the frame body 140b. In addition, for example, the holding arm 110 may be configured to be bent only once and connect the long side 131b of the base 130 and the frame body 140c or 140d. Moreover, it is needless to say that each embodiment is illustrative and the components in the different embodiments may be partially replaced or combined, and they are also included in the scope of the present invention as long as the features of the present invention are included.

REFERENCE SIGNS LIST 1 resonance device
10 resonator 30 upper cover
20 lower cover
140 holding portion
140a to 140d frame body
110 holding arm
111a to 114a, 111b to 114b arm
120 vibration portion
130 base portion
131a, 131b long side
131c, 131d short side
135A to 135D vibration arm
138, 139 connection portion

The invention claimed is:

1. A resonator comprising:
a base;
a plurality of vibration arms each connected at ends thereof to a front of the base and disposed so as to be spaced apart from each other and to extend in a direction away from the base; and
a connection member that connects at least two of the plurality of vibration arms, wherein the plurality of vibration arms include first, second, third and fourth vibration arms with the third and fourth vibration arms disposed between the first and second vibration arms relative to a lengthwise direction of the front of the base.

2. The resonator according to claim 1, wherein the connection member connects the at least two vibration arms that are configured to bend in a same direction when an electric field is applied.

3. The resonator according to claim 1, wherein the plurality of vibration arms each have a piezoelectric substance and a pair of electrode layers opposing each other with the piezoelectric substance interposed therebetween.

4. The resonator according to claim 1, wherein the connection member connects the first vibration arm to the second vibration arm.

5. The resonator according to claim 1, wherein the connection member connects the third vibration arm to the fourth vibration arm.

6. The resonator according to claim 5, wherein the connection member connects respective free ends of the third vibration arm and the fourth vibration arm, with the free ends being opposite the ends connected to the front of the base.

7. The resonator according to claim 1, wherein the first and second vibration arms have a substantially same shape and the third and fourth vibration arms have a substantially same shape.

8. The resonator according to claim 1, wherein a distance between the third and fourth vibration arms is greater than a distance between the third vibration arm and the first vibration arm and a distance between the fourth vibration arm and the second vibration arm.

9. The resonator according to claim 8, wherein the connection member connects the third vibration arm to the fourth vibration arm at respective free ends thereof.

10. The resonator according to claim 1, further comprising a frame and a pair of holding arms coupling the base to the frame.

11. The resonator according to claim 10, wherein the pair of holding arms respectively couple opposing sides of the frame to a back of the base that is opposite the front of the base.

12. The resonator according to claim 1, further comprising a plurality of weights disposed on respective free ends of the plurality of vibration arms opposite the ends connected to the front of the base.

13. A resonator comprising:
a base;
a plurality of vibration arms extending from a same side of the base, with each vibration arm having a fixed end coupled to the base and a free end opposite the fixed end; and
a vibration arm connector that connects at least two of the plurality of vibration arms at respective positions of the at least two vibration arms other than the fixed end,
wherein the plurality of vibration arms include first, second, third and fourth vibration arms with the third and fourth vibration arms disposed between the first and second vibration arms relative to a lengthwise direction of the front of the base.

14. The resonator according to claim 13, wherein the vibration arm connector connects the respective free ends of the at least two vibration arms.

15. The resonator according to claim 13, further comprising a plurality of weights disposed on the free ends, respectively, of the plurality of vibration arms.

16. The resonator according to claim 13, further comprising:
a frame; and
a pair of holding arms coupling the base to the frame,
wherein the pair of holding arms respectively couple opposing sides of the frame to a side of the base that is opposite the side of the base coupled to the fixed ends of the vibration arms.

17. A resonator comprising:
a base;
a pair of inner vibration arms extending from a side of the base and a pair of outer vibration arms extending from the side of the base with the inner vibration arms disposed therebetween, wherein each vibration arm has a fixed end coupled to the base and a free end opposite the fixed end; and
a vibration arm connector that connects either the respective free ends of the pair of inner vibration arms or the respective free ends of the pair of outer vibration arms.

18. The resonator according to claim 17, wherein a distance between the pair of inner vibration arms is greater than a distance between one of the pair of inner vibration arms and an adjacent outer vibration arm of the pair of outer vibration arms.

19. The resonator according to claim 17, wherein each of the pair of inner vibration arms and the pair of outer vibration arms comprises a weight disposed on the respective free end.

20. The resonator according to claim 1, wherein the lengthwise direction is perpendicular to the direction in which the plurality of vibration arms extend.

* * * * *